United States Patent [19]

Uehara

[11] Patent Number: 4,675,983
[45] Date of Patent: Jun. 30, 1987

[54] METHOD OF MAKING A SEMICONDUCTOR INCLUDING FORMING GRAFT/EXTRINSIC AND INTRINSIC BASE REGIONS

[75] Inventor: Keijiro Uehara, Sagamihara, Japan

[73] Assignee: Hitachi, Ltd., Tokyo, Japan

[21] Appl. No.: 741,524

[22] Filed: Jun. 5, 1985

[30] Foreign Application Priority Data

Jun. 6, 1984 [JP] Japan .................. 59-114560

[51] Int. Cl.⁴ .................. H01L 21/302; H01L 21/265
[52] U.S. Cl. .................. 29/576 B; 29/578;
148/1.5; 148/187; 156/643; 357/34
[58] Field of Search .............. 148/1.5, 187; 29/576 B,
29/578; 156/643; 357/34

[56] References Cited

U.S. PATENT DOCUMENTS

| | | | |
|---|---|---|---|
| 3,717,507 | 2/1973 | Abe | 148/1.5 |
| 4,111,726 | 9/1978 | Chen | 148/175 |
| 4,157,269 | 6/1979 | Ning et al. | 148/1.5 |
| 4,318,751 | 3/1982 | Horng | 148/1.5 |
| 4,381,953 | 5/1983 | Ho et al. | 148/1.5 |
| 4,398,962 | 8/1983 | Kanazawa | 148/1.5 |
| 4,415,384 | 11/1983 | Hashimoto | 148/187 |
| 4,418,469 | 12/1983 | Fujita | 29/577 C |
| 4,477,965 | 10/1984 | Blossfeld | 29/576 B |
| 4,483,738 | 11/1984 | Blossfeld | 148/1.5 |
| 4,545,114 | 10/1985 | Ito et al. | 29/576 B |

Primary Examiner—Upendra Roy
Attorney, Agent, or Firm—Antonelli, Terry & Wands

[57] ABSTRACT

An impurity-doped region that serves as an intrinsic base region of a bipolar transistor is formed in a very early stage, and an electrode for taking out the base and a graft base region are formed in a late stage. This makes it possible to reliably connect the intrinsic base region and the graft base region together without permitting them to separate away from each other even when the base region has a very small depth.

30 Claims, 7 Drawing Figures

METHOD OF MAKING A SEMICONDUCTOR INCLUDING FORMING GRAFT/EXTRINSIC AND INTRINSIC BASE REGIONS

BACKGROUND OF THE INVENTION

The present invention relates to a process for producing semiconductor devices. More specifically, the invention relates to a process for producing semiconductor devices in which an intrinsic base region of a bipolar transistor is reliably connected to a graft base region thereof.

Referring to the base of a bipolar transistor as is well known, a portion formed just under the emitter region is called intrinsic base region, and a portion outside the intrinsic base portion, i.e., a portion where a base contact is formed, is called graft base region or external base region.

So far, bipolar transistors have generally been manufactured by a process according to which the graft base region is formed, and the intrinsic base region is formed that portions of the two regions are overlapped.

In recent years, however, there has been proposed a method according to which the graft base region and the emitter region are formed by the self-alignment technique to increase the degree of integration of semiconductor devices and improving characteristics of the semiconductor devices at high frequencies (see, for example, Japanese Patent Publication No. 27469/1980).

An example of such a method will be explained below in conjunction with FIGS. 1a and 1b.

First, as shown in FIG. 1a, in a case of an npn-type transistor will be formed a thick silicon dioxide film 2' is selectively formed by the well-known LOCOS method, on the surface of the silicon substrate 1' to isolate elements from each other. In this case, a polycrystalline silicon film 3' heavily doped with boron ions is formed and then, the unnecessary portion is formed to form an opening 6'.

Next, a silicon dioxide film 4' is formed on the surface of the polycrystalline silicon film 3' by thermal oxidation, by utilizing the phenomenon that polycrystalline silicon heavily doped with boron ions undergoes oxidation at a very high rate. At this moment, boron ions contained in the polycrystalline silicon film 3' are diffused into the silicon substrate 1', so that a graft base region 5' is formed simultaneously with the silicon dioxide film 4'.

Based upon the ion implantation technique, impurities for forming the base region are, first, implanted into the surface region of the silicon substrate 1 as indicated by arrows 10' and then impurities for forming the emitter region are implanted thereinto, followed by the heating. Thus, there are formed an intrinsic base region 7' and an emitter region 8' as shown in FIG. 1b.

When a gap $\Delta BE$ is small between the graft base region 5' and the emitter region 8', the graft base region 5' and the intrinsic base region 7' are connected to each other making it possible to form a good bipolar transistor.

When the gap $\Delta BE$ is large, however, the graft base region 5' and the intrinsic base region 7' are formed being separated from each other as shown in FIG. 2, and the base resistance increases remarkably.

Further, depths of the base region and emitter region decrease remarkably with the decrease in the size of the transistor. To connect such a very shallow intrinsic base region to the graft base region without interruption, however, the gap $\Delta BE$ must be controlled maintaining very high precision.

It is, however, very difficult to control the gap between the graft base region and the emitter region maintaining high precision, and it is further difficult to prevent the graft base region from separating from the intrinsic base region. These facts account for variance in the characteristics of bipolar transistors and for the production of unacceptable products.

SUMMARY OF THE INVENTION

The object of the present invention is to provide a process for producing semiconductor devices, which eliminates the above-mentioned problems inherent in the conventional art, and which is capable of reliably connecting a graft base region and an intrinsic base region together without interruption even when the base region and emitter region have small depths.

In order to achieve the above object according to the present invention, an impurity-doped region that serves as an intrinsic base region is formed in a very early stage in contrast with the conventional art in which the impurity-doped region is formed in a very late stage, and then a polycrystalline silicon film (electrode for taking out the base) and a graft base region are formed, to eliminate defective connection between the graft base region and the intrinsic base region.

DETAILED DESCRIPTION OF THE PREFERRED EMBODIMENTS

Figure 3A:
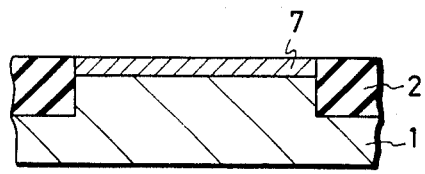
FIGS. 3a to 3d are diagrams showing the steps according to an embodiment of the present invention.

Desired portions of the surface of an n-type single crystalline silicon substrate 1 are selectively oxidized by the widely known LOCOS method using silicon nitride film as a mask, in order to form a thick silicon dioxide film (1 $\mu$m thick) 2 for isolating elements, as shown in FIG. 3a.

The silicon nitride film used as a mask for selective oxidation at the time of forming the silicon dioxide film 2, is then removed, and the surface of a region (active region) where the transistor will be formed is exposed. Then, boron ions are implanted at an acceleration voltage of 50 KeV to form a boron-doped region 7 which is 0.1 $\mu$m deep. Here, the ions may be implanted by forming a thin insulating film on the surface of the semiconductor substrate.

Good results are obtained if boron ions are implanted in a dosage of about $1 \times 10^{13}$/cm$^2$ to $1 \times 10^4$/cm$^2$. The boron-doped region 7 can also formed by the well-known thermal diffusion method instead of the ion implanation method.

In this embodiment, the n-type silicon substrate is doped with boron ions that are p-type impurities in order to form an npn-type bipolar transistor. When it is desired to form a pnp-type bipolar transistor, however, the p-type silicon substrate should be doped with n-type impurities such as phosphorus ions or arsenic ions in a like manner, as a matter of course.

Figure 3B:
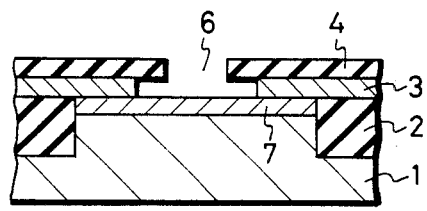

Next, as shown in FIG. 3b, there are formed a polycrystalline silicon film 3 heavily doped with boron ions and an insulating film 4 laminated thereon.

A desired portion of the insulating film 4 is selectively removed by the well-known photoetching technique, an exposed portion of the polycrystalline silicon film 3 is removed by etching, and then sides of the polycrystalline silicon film 3 is removed by etching in canopy form.

The polycrystalline silicon film 3 may be doped with boron ions in advance, or may be doped with boron ions in a subsequent step by the ion implanation or diffusion.

According to this embodiment, the insulating film 4 consists of a silicon dioxide film which is formed by the thermal decomposition of $SiH_4$ and which is 700 nm thick.

Here, it is essential that only the polycrystalline silicon film 3 is selectively etched, and the silicon substrate is not substantially etched. According to this embodiment, use is made of an etching method which exhibits a high etching rate for polycrystalline silicon that contains large amounts of boron ions and which exhibits a low etching rate for silicon substrate. That is, use is made of an etching solution consisting of nitric acid, glacial acetic acid and hydrofluoric acid that are mixed at a ratio of 100 to 100 to 1. By using the above etching solution, the polycrystalline silicon film 3 is selectively etched without substantially etching the silicon substrate 1 and the silicon dioxide film 4, to obtain construction shown in FIG. 3b.

Figure 3C:
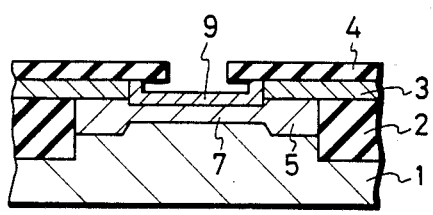

The heat-treatment is effected in an oxidizing atmosphere to oxidize the exposed surface of the silicon substrate and side surfaces of the polycrystalline silicon film 3, thereby to form a silicon dioxide film 9 as shown in FIG. 3c.

In this case, boron ions contained in the polycrystalline silicon film 3 are diffused into the silicon substrate 1 by the heat-treatment and whereby a graft base region 5 is formed. The heat-treatment may be carried out in an oxidizing atmosphere of 1 atms. By elevating the pressure of oxygen, air or water vapor, however, the processing time can be reduced.

According to this embodiment as will be obvious from FIG. 3c, the boron-doped region 7 that serves as an intrinsic base region is formed first, and then boron ions are diffused into a portion of the boron-doped region 7 to form the graft base region 5. Therefore, it will be obvious that the intrinsic base region 7 and the graft base region 5 are not separated from each other but are reliably connected together.

Figure 3D:
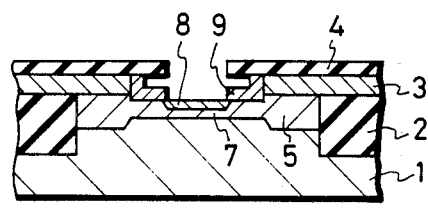

Using the insulating film 4 as a mask, the silicon dioxide film 9 is etched by reactive sputter etching, and is removed from a portion where the emitter will be formed, as shown in FIG. 3d.

Arsenic ions that serve as n-type impurities are implanted into the exposed portion of the silicon substrate 1 and, then the heat-treatment is effected to form an emitter region 8 which is 0.2 $\mu$m deep. At this moment, boron ions contained in the boron-doped region 7 are also diffused to form an intrinsic base region which is 0.3 $\mu$m deep. Thereafter, wiring and protecting films (not shown) are formed by an ordinary method, in order to form a bipolar transistor with the polycrystalline silicon film 3 as an electrode for taking out the base and with the silicon substrate (epitaxial silicon layer) 1 as a colletor, as shown in FIG. 3d.

Figure 1A:
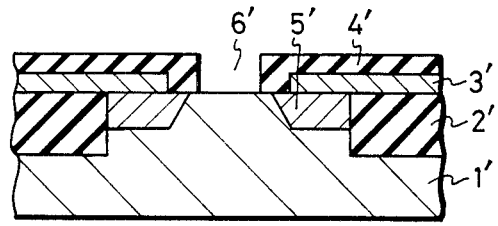
FIGS. 1a and 1b are diagrams showing conventional steps for producing semiconductor devices.
Figure 1B:
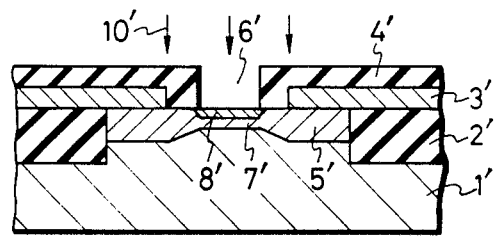
Figure 2:
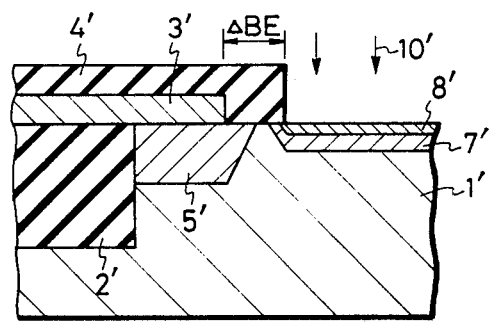
FIG. 2 is a diagram which illustrates defective connection between the graft base region and the intrinsic base region in a bipolar transistor.

According to the present invention as will be obvious from FIGS. 3a to 3d, an impurity-doped region that serves as the intrinsic base region is formed first contrary to the conventional method of FIGS. 1a and 1b, and the graft base region is formed in a subsequent step so as to be partly overlapped on the impurity-doped region.

Therefore, even when the base region and the emitter region have very small depths, the graft base region and the intrinsic base region are not separated from each other but are reliably connected together.

Thus, the present invention makes it possible to easily obtain a bipolar transistor having a very small size and excellent high-frequency characteristics, maintaining high precision.

In a semiconductor integrated circuit, in general, not only the transistor but also a resistor is formed in the surface region of the semiconductor substrate by the implanation of impurities. According to the present invention, the resistor can be formed simultaneously with the formation of the impurity-doped region 7. This fact makes one of the features of the present invention.

For the purpose of easy explanation and easy comprehension, those portions that are not directly related to the present invention are not described. For instance, the bipolar transistor usually has a buried layer and an electrode for taking out the collector. However, they are not directly related to the present invention, and are not diagrammed or explained.

Furthermore, it is a widely known fact that the emitter region and the base region of the bipolar transistor are formed in the surface region of the epitaxial silicon layer. In this specification, however, the epitaxial silicon layer is not described but simply the silicon substrate is described. In the above embodiment, furthermore, the emitter region is formed by the ion implantation method. It is however, a widely known fact that the emitter region can be formed by any other well-known method such as thermal diffusion of ions from the silicon dioxide film which contains impurities of the first type of conductivity in large amounts.

What is claimed is:

1. A process for producing semiconductor devices comprising the steps of:

forming an impurity-doped region having a second type of conductivity in a portion where a transistor is to be formed in the surface region of a semiconductor substrate which has a first type of conductivity, said impurity-doped region to constitute an intrinsic base region of the transistor of a semiconductor device;

after forming said impurity-doped region, forming a graft base region by doping impurities of the second type of conductivity into a desired portion in said impurity-doped region to a depth greater than the depth of said impurity-doped region; and forming an emitter region by doping impurities of the first type of conductivity into a desired portion in said impurity-doped region to a depth smaller than the depth of said impurity-doped region, whereby said emitter region is formed over said intrinsic base region.

2. A process for producing semiconductor devices according to claim 1, wherein said impurity-doped region is formed by the implanation of ions.

3. A process for producing semiconductor devices according to claim 1, wherein said impurity-doped region is formed by the thermal diffusion of ions.

4. A process for producing semiconductor devices according to claim 1, wherein said graft base region is formed by thermally diffusing ions from a polycrystalline silicon film which contains large amounts of impurities of the second type of conductivity.

5. A process for producing semiconductor devices according to claim 1, wherein said emitter region is formed by the implanation of ions.

6. A process for producing semiconductor devices according to claim 1, wherein said emitter region is formed by the thermal diffusion of ions.

7. A process for producing semiconductor devices according to claim 1, wherein said impurities of the second type of conductivity are boron ions.

8. A process for producing semiconductor devices according to claim 1, wherein said impurities of the first type of conductivity are arsenic ions or phosphorus ions.

9. A process for producing semiconductor devices according to claim 1, comprising the further step of forming an electrode contacting the base region of the transistor of the semiconductor device, said electrode being formed after formation of the impurity-doped region.

10. A process for producing semiconductor devices according to claim 1, wherein the graft base region is formed so as to partly overlap the impurity-doped region, whereby the intrinsic base region and graft base region are connected together.

11. A process for producing semiconductor devices according to claim 1, wherein, simultaneously with forming the impurity-doped region, impurities are doped into another portion of the semiconductor substrate so as to form a resistor of said semiconductor device.

12. A process for producing semiconductor devices according to claim 1, wherein the semiconductor substrate is an epitaxial semiconductor layer formed on a substrate.

13. A process for producing semiconductor devices according to claim 1, wherein the semiconductor substrate is formed of silicon.

14. A process for producing semiconductor devices according to claim 1, wherein the impurity-doped region is a thin region, so as to provide an intrinsic base region having a thin base width.

15. A process for producing semiconductor devices according to claim 4, wherein said polycrystalline silicon film is located directly on said desired portion of said impurity-doped region.

16. A process for producing semiconductor devices according to claim 7, wherein said exposed portion of the polycrystalline silicon film and the sides of the polycrystalline silicon film are etched substantially without etching of the semiconductor substrate.

17. A process for producing semiconductor devices according to claim 7, wherein said forming a graft base region is performed after said forming the polycrystalline silicon film.

18. A process for producing semiconductor devices according to claim 7, wherein said polycrystalline silicon film is formed into an electrode for the base region of said transistor of the semiconductor device.

19. A process for producing semiconductor devices according to claim 7, wherein the graft base region is formed so as to partly overlap the impurity-doped region, whereby the intrinsic base region and graft base region are connected together.

20. A process for producing semiconductor devices according to claim 7, wherein the impurity-doped region is a thin region, so as to provide an intrinsic base region having a thin base width.

21. A process for producing semiconductor devices according to claim 7, wherein the semiconductor substrate is an epitaxial semiconductor layer formed on a substrate.

22. A process for producing semiconductor devices comprising the steps of:

forming an impurity-doped region of a second type of conductivity in a portion where a transistor is to be formed in the surface region of a semiconductor substrate which has a first type of conductivity, said impurity-doped region to constitute an intrinsic base region of the transistor of a semiconductor device;

after forming said impurity-doped region, forming a polycrystalline silicon film containing large amounts of impurities of the second type of conductivity and an insulating film laminated thereon;

removing a desired portion of said insulating film so as to expose a portion of the polycrystalline semiconductor film, removing by etching the exposed portion of said polycrystalline silicon film, and etching the sides of said polycrystalline silicon film, thereby leaving a remaining part of the polycrystalline silicon film;

after forming said impurity-doped region, and after removing by etching the exposed portion of said polycrystalline silicon film and etching the sides of said polycrystalline silicon film, forming a graft base region by diffusing said impurities of the second type of conductivity contained in the remaining part of the polycrystalline silicon film into a desired portion of said impurity-doped region of the second conductivity type; and forming an emitter region by doping impurities of the first type of conductivity into another desired portion of said impurity-doped region of the second type of conductivity.

23. A process for producing semiconductor devices according to claim 22, wherein said impurity-doped region of the second type of conductivity is formed by the implantation of ions.

24. A process for producing semiconductor devices according to claim 22, wherein said impurity-doped region of the second type of conductivity is formed by the thermal diffusion of ions.

25. A process for producing semiconductor devices according to claim 22, wherein said impurities of the second type of conductivity are boron ions.

26. A process for producing semiconductor devices according to claim 22, wherein said impurities of the first type of conductivity are arsenic ions or phosphorus ions.

27. A process for producing semiconductor devices according to claim 22, wherein said polycrystalline silicon film is etched using a mixture solution consisting of nitric acid, glacial acetic acid and hydrofluoric acid.

28. A process for producing semiconductor devices according to claim 22, wherein said polycrystalline silicon film containing large amounts of impurities of the second type of conductivity is formed directly on said desired portion of said impurity-doped region, whereby the impurities of the second type of conductivity diffuse from said polycrystalline silicon film into said desired portion of said impurity-doped region.

29. A process for producing semiconductor devices according to claim 22, wherein the step of forming the emitter region is performed after the step of removing a desired portion of the insulating film and after removing by etching the exposed portion of the polycrystalline silicon film.

30. A process for producing semiconductor devices according to claim 29, wherein the step of forming the emitter region is performed after the step of forming the graft base region.

* * * * *